(12) United States Patent
Binder et al.

(10) Patent No.: US 12,126,213 B2
(45) Date of Patent: Oct. 22, 2024

(54) SYSTEM AND METHOD FOR MONITORING POWER SUPPLY DEVICES

(71) Applicant: Solaredge Technologies Ltd., Herzeliya (IL)

(72) Inventors: Yaron Binder, Shoham (IL); Yehuda Levy, Jerusalem (IL); Ilan Yoscovich, Ramat Gan (IL)

(73) Assignee: Solaredge Technologies Ltd., Herzeliya (IL)

( * ) Notice: Subject to any disclaimer, the term of this patent is extended or adjusted under 35 U.S.C. 154(b) by 0 days.

(21) Appl. No.: 17/034,527

(22) Filed: Sep. 28, 2020

(65) Prior Publication Data

US 2021/0099009 A1    Apr. 1, 2021

Related U.S. Application Data

(60) Provisional application No. 62/906,838, filed on Sep. 27, 2019.

(51) Int. Cl.
    *H02J 9/06*      (2006.01)
    *G16Y 10/75*      (2020.01)
    *H02J 7/02*      (2016.01)
    *H02M 5/04*      (2006.01)

(52) U.S. Cl.
    CPC ............. *H02J 9/062* (2013.01); *G16Y 10/75* (2020.01); *H02J 7/02* (2013.01); *H02M 5/04* (2013.01)

(58) Field of Classification Search
CPC . H02J 9/062; H02J 7/02; G16Y 10/75; H02M 5/04
USPC .......................................................... 307/64
See application file for complete search history.

(56) References Cited

U.S. PATENT DOCUMENTS

| | | | | |
|---|---|---|---|---|
| 6,671,635 B1 * | 12/2003 | Forth | ..................... | G01R 35/04 |
| | | | | 702/62 |
| 7,492,058 B2 | 2/2009 | Chen | | |
| 8,193,662 B1 * | 6/2012 | Carlson | ..................... | G06F 1/30 |
| | | | | 307/64 |
| 8,587,929 B2 * | 11/2013 | Johnson, Jr. | ............. | H02J 9/062 |
| | | | | 361/601 |
| 8,890,373 B2 | 11/2014 | Savolainen et al. | | |
| 2003/0033550 A1 | 2/2003 | Kuiawa et al. | | |
| 2003/0048006 A1 * | 3/2003 | Shelter, Jr. | ............... | H02J 9/061 |
| | | | | 307/64 |

(Continued)

FOREIGN PATENT DOCUMENTS

| | | |
|---|---|---|
| WO | 2005091460 A2 | 9/2005 |
| WO | 2017204866 A1 | 11/2017 |

OTHER PUBLICATIONS

Dec. 21, 2020—Extended European Search Report—EP 20198720.3.

*Primary Examiner* — Michael R. Fin
(74) *Attorney, Agent, or Firm* — Banner & Witcoff, Ltd.

(57) ABSTRACT

A multiplicity of uninterruptible power supply (UPS) devices may be equipped with a plurality of sensors which report on the state of various operational parameters of the UPS devices to a registry device. Output of the registry device may be displayed on a dedicated GUI and/or written to log files at a monitoring station. In the event that one or more sensors reports a parameter to the registry device which is indicative of a malfunction of one or more of the UPS devices, examination the registry device output may indicate which UPS device or devices is/are malfunctioning. Related embodiments, apparatus, systems, and methods are also discussed.

20 Claims, 5 Drawing Sheets

(56) References Cited

U.S. PATENT DOCUMENTS

| | | |
|---|---|---|
| 2003/0132949 A1 | 7/2003 | Fallon et al. |
| 2003/0160514 A1* | 8/2003 | Rajagopalan ............. H02J 9/08 |
| | | 307/65 |
| 2007/0210650 A1* | 9/2007 | Togashi ............... G06F 11/1441 |
| | | 307/43 |
| 2007/0217125 A1 | 9/2007 | Johnson |
| 2009/0152952 A1* | 6/2009 | Evans, Sr. ................. H02J 7/34 |
| | | 307/125 |
| 2010/0001868 A1 | 1/2010 | Liao |
| 2013/0002027 A1* | 1/2013 | Yu ........................... H02J 9/061 |
| | | 307/64 |
| 2013/0193759 A1* | 8/2013 | Giuntini ................. H02J 9/062 |
| | | 307/64 |
| 2013/0234690 A1 | 9/2013 | Matsutani |
| 2014/0181949 A1 | 6/2014 | Hunter |
| 2015/0180920 A1* | 6/2015 | Hunter ................. H04L 67/025 |
| | | 709/203 |
| 2016/0164839 A1* | 6/2016 | Melton ............... H04L 63/0227 |
| | | 726/15 |
| 2018/0152046 A1 | 5/2018 | Toyoda et al. |
| 2019/0058352 A1* | 2/2019 | Gow ................... H01M 10/441 |

* cited by examiner

SYSTEM AND METHOD FOR MONITORING POWER SUPPLY DEVICES

CROSS-REFERENCE TO RELATED APPLICATIONS

The present application claims priority benefit of U.S. Provisional Patent Application No. 62/906,838, entitled "SYSTEM AND METHOD FOR MONITORING POWER SUPPLY DEVICES," which is hereby incorporated by reference in its entirety.

BACKGROUND

An uninterruptible power supply (UPS, sometimes referred to as an uninterruptible power source) is one of a category of power supplying devices that provides power to a load upon failure of an input power source, such as a power grid. UPS devices typically provide protection from input power interruptions, by providing the load with power which is typically stored in a battery, a super-capacitor, or a flywheel, or other appropriate energy storage device. Runtime of the UPS may be short (typically limited by storage capacity of the battery, super-capacitor, flywheel, or other appropriate storage device), but typically may provide sufficient time to either restore power from the power grid or to properly shut down the load.

UPS devices may be stand alone, or they may be linked together with other UPS devices in parallel. In such a configuration, a shared processor/controller may also be present in order to provide network access to the UPS devices.

SUMMARY

The present disclosure seeks to provide an improved method and system for monitoring of individual power supply devices, such as uninterruptible power supply (UPS) devices, among a plurality of such devices (for example, when the UPS devices are in a rack).

In one aspect described herein, a multiplicity of UPS devices which may be housed together in a rack are individually provided with an additional output which is in contact with a sensor. The sensor(s) may be configured to detect signs of electrical activity from individual UPS devices. In the event that one of the UPS devices malfunctions, the identity of the malfunctioning UPS device among the multiplicity of UPS devices may be determined by examination of measurements received from the sensors and/or sensor interfaces to determine which sensor is indicating that its corresponding UPS device does not have electrical activity. Determination of the malfunctioning UPS is thereby performed without exposing the UPS devices to an external network (e.g., the Internet).

In another aspect described herein, a multiplicity of UPS devices may be equipped with a plurality of sensors which report on the state of various operational parameters of the UPS devices to a registry device. Output of the registry device may be displayed on a dedicated graphical user interface (GUI) and/or written to log files at a monitoring station. In the event that one or more sensors reports a parameter to the registry device which is indicative of a malfunction of one or more of the multiplicity of UPS devices, examination of the registry device output may indicate which of the one or more UPS devices is malfunctioning.

BRIEF DESCRIPTION OF THE DRAWINGS

The present disclosure will be understood and appreciated more fully from the following detailed description, taken in conjunction with the drawings in which.

DETAILED DESCRIPTION

Figure 1:
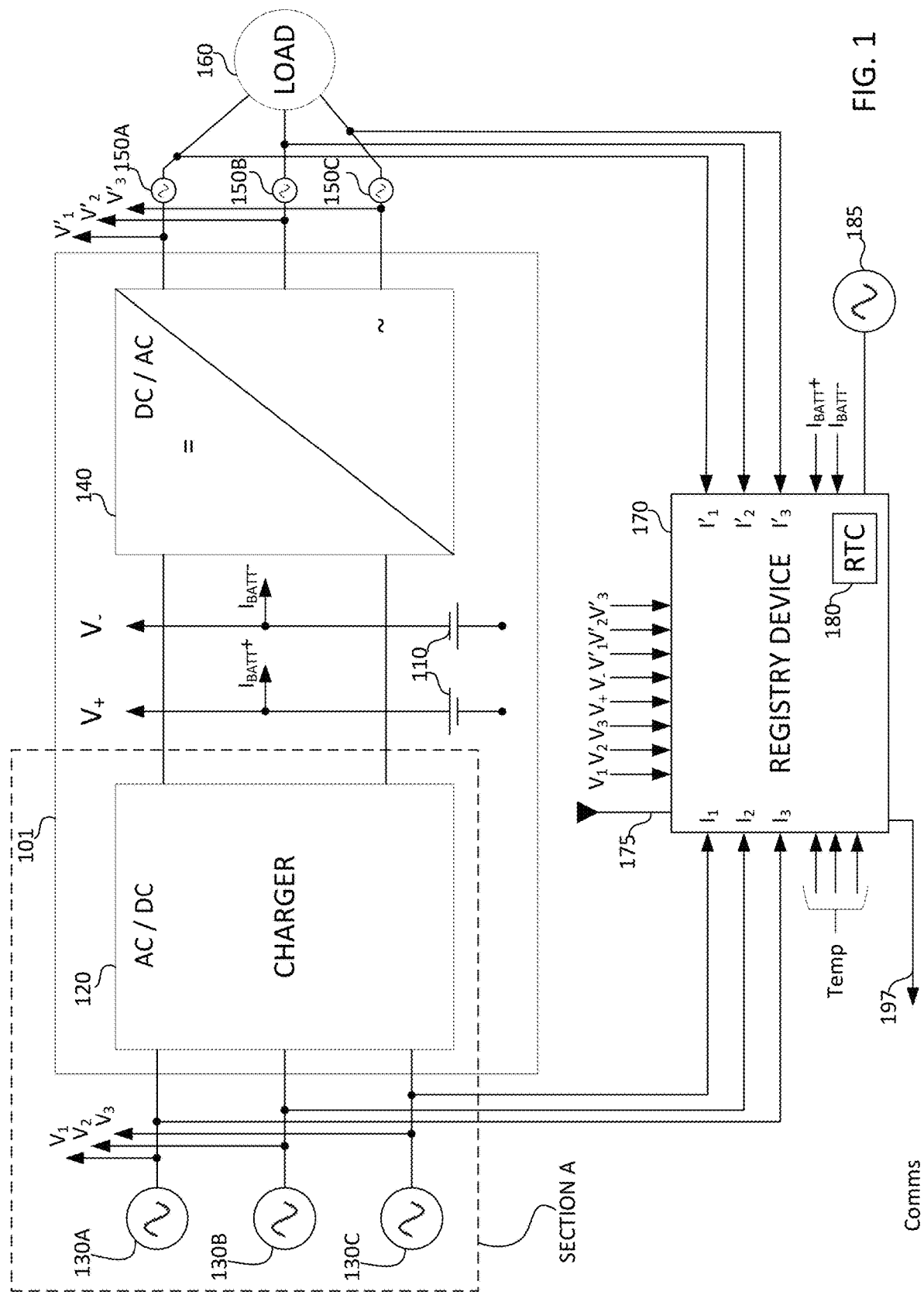
FIG. 1 is a simplified block diagram of an exemplary system in which a registry device is implemented for an uninterruptible power supply (UPS) device in accordance with the present disclosure.

Reference is now made to FIG. 1, which is a simplified block diagram of a system in which a registry device is implemented for an uninterruptible power supply (UPS) device 101 in accordance with the present disclosure. The UPS device 101 comprises at least one battery for storing electric power. Two batteries 110 are depicted in FIG. 1, by way of example. One, two, three, or some other number of batteries may actually be used in practice. Certain UPS topologies may utilize one, two, or other numbers of batteries. A battery charger 120 receives an alternating current (AC) electrical power input 130A, 130B, 130C, here depicted as a three phase input, by way of a non-limiting example (e.g., in some systems a one phase input may be received, and in other systems multiple phases of AC power may be received as inputs). The battery charger 120 may comprise a power factor correction (PFC) charger, or any other appropriate type of battery charger, as will be appreciated by persons of skill in the art. The battery charger 120 converts the AC electrical power input 130A, 130B, 130C to direct current (DC), which is stored in the at least one battery 110.

An inverter 140 receives DC power as an input either from the battery 110 or from the battery charger 120. For example, in some circumstances, if the at least one battery 110 is fully or nearly fully charged, DC power from the battery charger 120 may be provided directly to the inverter 140. In some circumstances, for example, in the event of an interruption of the AC electrical power input 130A, 130B, 130C, the at least one battery 110 provides DC power to the inverter 140. The inverter 140 converts DC power to an AC output 150A, 150B, 150C, depicted here as being a three phase AC output 150A, 150B, 150C. The AC output 150A, 150B, 150C is provided to a load 160. According to some aspects, inverter 140 may provide a single-phase AC output. The present disclosure is described with respect to a double conversion UPS device, where alternating current (AC) electricity is rectified to direct current (DC) electricity, which charges a battery and is output to an inverter, which converts the DC back to AC.

Although not explicitly described herein, other UPS topologies, such as standby mode UPS devices (where a load is powered directly by input power, and backup UPS power circuitry is invoked when the input power fails), line-interactive UPS devices (having an inverter in line, and the UPS device redirects DC current from the battery to supply current to the load when power is lost), etc., are also considered within the scope of the current disclosure. A registry device 170, which will be described in greater detail below, receives as input, data sensed by one or more of the various sensors described herein.

Figure 2:
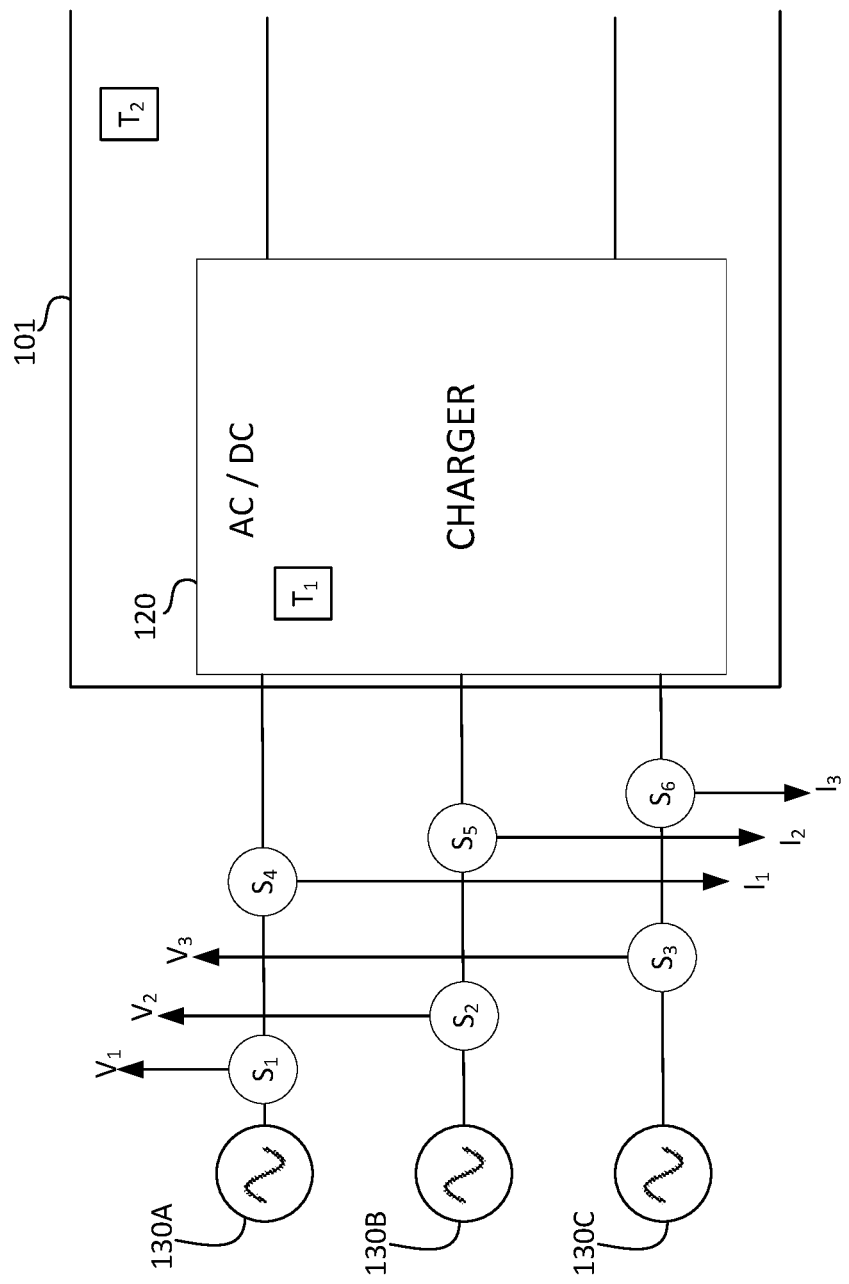
FIG. 2 is a detailed depiction of Section A of FIG. 1.

Reference is now made to FIG. 2, which is a detailed depiction of Section A of FIG. 1. FIG. 2 is provided in order to add detail, which, for ease of depiction, is more conveniently depicted in a "zoomed-in" view. A plurality of sensors are added to the depiction of the system depicted in FIG. 1. It is appreciated that said devices may be present in the UPS device 101 of FIG. 1, but do not appear in FIG. 1 for ease of depiction. Said devices may be present in a housing in which the UPS device 101 of FIG. 1 is housed. However, for ease of depiction, in FIGS. 1 and 2 said devices are depicted outside the UPS device 101. For example, sensors $S_1$, $S_2$, and $S_3$, respectively, measure voltage of electrical AC power inputs 130A, 130B, 130C, respectively indicated as $V_1$, $V_2$, and $V_3$. Sensors $S_4$, $S_5$, and $S_6$ measure an AC current from inputs 130A, 130B, 130C respectively, flowing through their respective cables. The measured AC current from inputs 130A, 130B, 130C are, respectively, indicated as $I_1$, $I_2$, and $I_3$.

Temperature sensor $T_1$ may measure a temperature of the battery charger 120. Temperature sensor $T_2$ may measure an ambient temperature inside a case which covers the UPS device 101. Additional sensors which measure parameters of the at least one battery 110, not depicted in FIGS. 1 and 2 may include, but not be limited to, sensors which measure positive voltage $V_+$, current from a positive battery terminal $I_{BATT+}$, negative voltage $V_-$, and current from a negative battery terminal $I_{BATT-}$, additional temperature sensors, clock frequencies, switching frequencies, and other operational frequencies, and so forth. It is appreciated that the at least one battery 110 may comprise more than one battery, e.g., battery 110B, ... (not depicted), and individual sensors may measure parameters on a per-battery or per-battery-cell level. Accordingly, and by way of example, there may be two sensors, one of which measures current from the negative battery terminal $I_{BATT1-}$ from a first battery of the at least one battery 110, and a second one that measures negative current $I_{BATT2-}$ from a second battery of the at least one battery 110. Similarly, sensors may be provided to measure a temperature of the at least one battery, a temperature of the inverter, and so forth. Sensors may detect output voltages $V'_1$, $V'_2$, and $V'_3$, output current flow $I'_1$, $I'_2$, and $I'_3$, and so forth (partially depicted in FIG. 1).

The various sensors described herein above and elsewhere may be commercially available voltage, current, frequency, and temperature sensors, or custom designed sensors, as appropriate. The various sensors described herein above may implement (or be connected to one or more communication devices implementing) one or more communication protocols, for instance, and by way of a non-limiting example, an Internet of Things (IoT) communication protocol for near range communication. Such IoT protocols may include (by way of a non-limiting list) Bluetooth®, Zigbee, Z-Wave, WiFi, NFC (Near Field Communication), WiFi direct, radio frequency (RF), and infrared (IR) communications. It is appreciated that some of the above-mentioned protocols may have specific requirements which may impose additional constraints on usage, such as a particular need for line-of-sight connectivity, etc. Sensors may also use wired connections, as described below.

Returning now to the description of FIG. 1, a registry device 170 is provided in proximity to the UPS device 101. The registry device 170 may be disposed inside the case which covers the UPS device 101, on a table or a rack where the UPS device 101 is placed, inside a control center in proximity to the UPS device 101, etc. The registry device 170 receives, as input, data sensed by one or more of the various sensors described above, including: a plurality of voltage data from voltage sensors $S_1$, $S_2$, $S_3$, and the other voltage sensors mentioned above which are described and not necessarily depicted in FIGS. 1 and 2; a plurality of current data from current sensors $S_4$, $S_2$, and $S_6$, and the other current sensors mentioned above which are described and not necessarily depicted in FIGS. 1 and 2; a plurality of frequency data of the various AC currents from frequency sensors $f_1$, $f_2$, and other frequency sensors disposed throughout the UPS device 101; temperature data from temperature sensors T1, T2, and other temperature sensors placed throughout the UPS device 101, and so forth. As described above, the various sensors may be in wireless communication with the registry device 170. The registry device 170 may be provided with at least one antenna 175 which may comprise an antenna designed to be operative at or near a particular frequency which is associated with a particular protocol, to enable the registry device 170 to receive wireless communication from the various sensors. Alternatively, the antenna may comprise an antenna which is operative at a wide range of frequencies. The at least one antenna 175 may be physically distant or otherwise isolated from the registry device 170 so as to reduce potential electro-magnetic interference between the at least one antenna 175, the batteries 110 of the UPS devices 101, or other potential sources of electro-magnetic interference.

Alternatively, the various sensors may be wired so as to be connected to the registry device 170 using a wired protocol, using, for instance, a synchronous serial communication interface, such as Serial Peripheral Interface bus (SPI), RS-232, Universal Asynchronous Receiver Transmitter (UART), Ethernet, and so forth. Additionally, the registry device 170 may receive data from the UPS devices either as analog data or as digital data.

The registry device 170 may also comprise a real time clock (RTC) 180. The RTC may be implemented as an integrated circuit, such as one of a commercially available DS1307, a DS32231 or a PCF8563 RTC integrated circuit. The RTC 180 may provide a date and time stamp for data received by the registry device 170. Additionally or alternatively, a UPS device, such as UPS device 101 may also have its own internal system logs which record UPS device 101 system data with a time stamp based on a local UPS device 101 RTC. In such a case, a time server broadcasting a server-based time, using, for instance, Network Time Protocol (NTP) may ensure that local logs and data recorded in the registry device 170 will have the same time stamp.

In addition, the registry device 170 is operative, at least via a communication port 197, of providing an output summarizing data which it has received. The output may, for example, be displayed on a dedicated GUI and/or written to log file(s) at a monitoring station. The monitoring station may be a dedicated computer, an application running on a dedicated computer, an application running on a computer which is also used for other purposes, and so forth. If the communications between the registry device 170 and the monitoring station is on a secure network which is not connected to the Internet, the UPS device 101 may be monitored in a highly secure fashion.

If the communications between the registry device 170 and the monitoring station is over a data communications network which is connected to the Internet, that network may be subject to attacks from attackers attempting to penetrate that network for malicious purposes. Cryptographic solutions and protocols invoked to secure Internet communications may be utilized for data security. Specifically, data sent to the monitoring station by the registry device 170 may be encrypted at the registry device 170. It is appreciated that utilizing such cryptographic solutions and secure protocols may come at a cost of higher computational expense, and therefore, such solutions might be less desirable in some instances. In general, it is the case that once the UPS device 101 is connected, over any of its interfaces, to the Internet or other public network, it may be at a higher degree of risk of attack from malicious persons.

The registry device 170 may provide a method to monitor the UPS device 101 without influencing operation of the UPS device 101, thereby limiting the exposure of the UPS device 101 to outside potentially dangerous connections from outside the local network and environment of the UPS device 101, as will be described below in greater detail. Communication between the registry device 170 and the UPS device 101 may comprise one-way communication, such that the UPS device 101 sends data to the registry device 170, however the registry device 170 does not send data communications to the UPS device 101. Accordingly, if an external agent (such as a hacker, a worm, a virus, etc.) is able to gain access to the registry device 170, the external agent will not be able to utilize a communication channel between the registry device 170 and the UPS device 101 in order to gain access to the UPS device 101. The one-way nature (i.e., unidirectional) of communication between the UPS device 101 and the registry device 170 effectively blocks the external agent from accessing the UPS device 101. Additionally, the registry device 170 may receive and record data from a multiplicity of UPS devices 101, such that data from the multiplicity of UPS devices 101 is effectively simultaneously recorded.

Further, the registry device 170 may have a power supply 185 which is independent of the UPS devices 101 and the AC electrical power input 130A, 130B, 130C to the UPS devices 101. Accordingly, if an attacker has gained control of the power supply of the registry device 170, the attacker does not, perforce, gain access to the UPS devices 101 or to the AC electrical power input 130A, 130B, 130C to the UPS devices 101.

UPS devices (such as UPS device 101 in the example of FIG. 1) come in various different types, such as an offline UPS device, a line interactive UPS device, and an online UPS device. Examples described herein may be implemented and or adapted in an appropriate fashion for use in a UPS device of any of those types, or other types. It is appreciated that the UPS devices 101 and/or the registry device 170 may comprise a controller (not depicted), which may be a controller common to the UPS devices 101 and the registry device 170, and/or there may be individual controllers which individually control the UPS devices 101 and the registry device 170. The controller may be disposed within a local (e.g., internal) network and may also provide a communications interface (e.g., a bidirectional communication interface), through which the UPS devices 101 may communicate over an external network (not depicted). As described above, the UPS device 101 communicates in a one-way fashion to the registry device 170, but may be blocked from communication external a local network. By way of example, network communications with an external network, such as, but not limited to, the Internet, may be blocked to the UPS devices 101. Blocking such external network communications from the UPS devices 101 may provide an additional layer of security to the UPS devices 101, providing a layer of deterrence from hostile agents attempting to access the UPS devices 101. Accordingly, the UPS devices 101 may comprise a first processor comprising a communication module operative to perform one-way communication, for instance, with the registry device 170. The one-way communication may comprise sending outgoing messages, the outgoing messages may be sent over a public data communications network. The UPS devices 101 may also comprise a second processor comprising a communication module operative to perform two-way communication over a private data communications network, such as the internal network described herein.

Figure 3A:
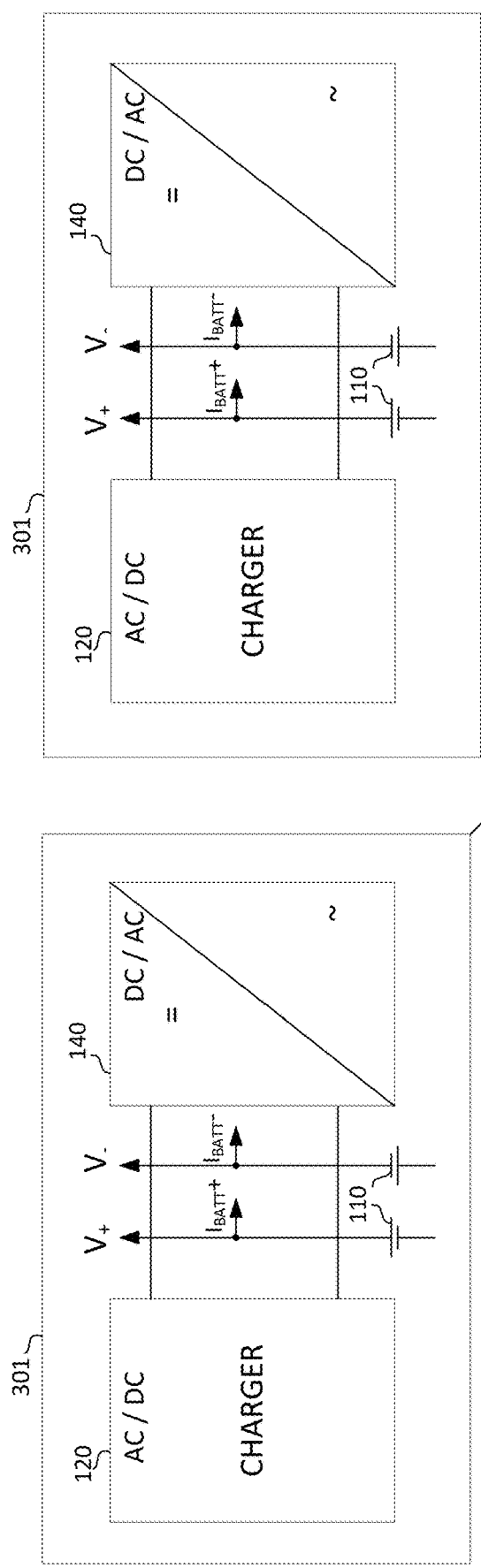
FIG. 3A is a simplified block diagram of an illustrative system comprising a plurality of UPS devices in communication with the registry device.
Figure 3A:
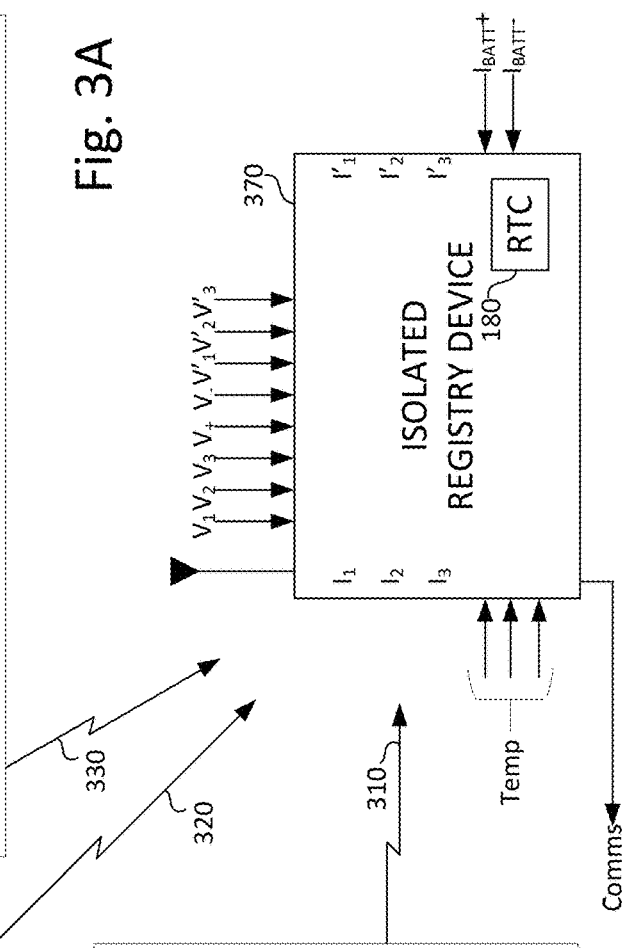
Figure 3A:
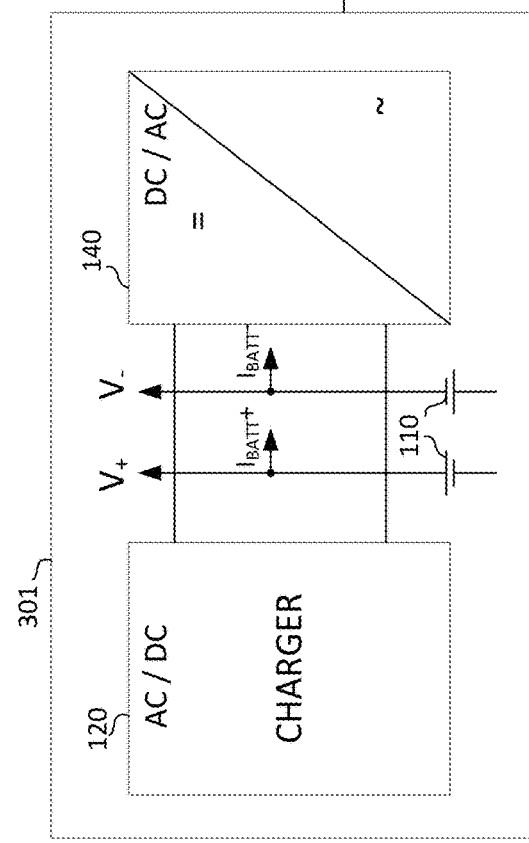

Reference is now made to FIG. 3A, which is a simplified block diagram of an illustrative system comprising a plurality of UPS devices 301 in communication with a registry device 370. With reference to the above discussion of the (single) UPS device 101 and the registry device 170, FIG. 3A depicts a plurality of UPS devices 301 which are shown as being in communication 310, 320, 330 with a single registry device 370. The UPS devices 301 may be the same or similar to one another, and to the UPS device 101 described above. Likewise, the single registry device 370 may be the same or similar to the registry device 170 described above with reference to FIGS. 1 and 2.

The arrows indicating communication 310, 320, 330 are not in direct contact with the registry device 370. As will be appreciated, the UPS devices UPS devices 301 are within communication range (which may depend on a communication protocol) of the registry device 370. As noted above, communications between the various sensors (which, for ease of depiction are not shown in FIG. 3A), described above, and the single registry device 370 may be performed using the various wireless near range communications protocols. Alternatively, and particularly if the UPS devices 301 are in a same location, communications may be over an appropriate wired protocol, which may include sending Hypertext Transfer Protocol (HTTP) packets over Ethernet via Transmission Control Protocol/Internet Protocol (TCP/IP). Alternative higher level protocols for sending data instead of or in addition to HTTP, include Hypertext Transfer Protocol Secure (HTTPS), Message Queuing Telemetry Transport (MQTT), Network News Transfer Protocol (NNTP), Extensible Messaging and Presence Protocol (XMPP), for example. One or more such higher level protocols, for instance, may be used to transfer data from the various sensors in the UPS devices 301 to the single registry device 370.

In some instances, one or more UPS device(s) 301 may comprise a 'local' registry device 370. In such cases, where there are a plurality of UPS devices, in a rack, or spread out over a floor of an office building, etc., for example, one or more 'local' registry device(s) 370 may communicate, in a one-way fashion, with a remote registry device 370. One example of such a scenario is provided below, with reference to FIG. 3B.

In some instances, the single registry device 370 may be remote to one or more of the plurality of UPS devices 301, as will be described herein below. In a first example, the plurality of UPS devices 301 may be situated in a single rack, and the single registry device 370 may also be located in the single rack. Alternatively, a plurality of racks, containing a plurality of UPS devices 301, may be disposed in a single room, and each rack of the plurality of racks may contain a dedicated registry device 370. In another example, the plurality of racks may be disposed, for instance, such that there is one or more rack on each floor of a multi-story building. Each floor may have one or more registry device 370, or there may be a single registry device 370 used for the whole building. The above examples are not meant to be limiting, and other combinations and sub-combinations of UPS devices, racks of UPS devices, and registry devices 370 are possible.

Figure 3B:
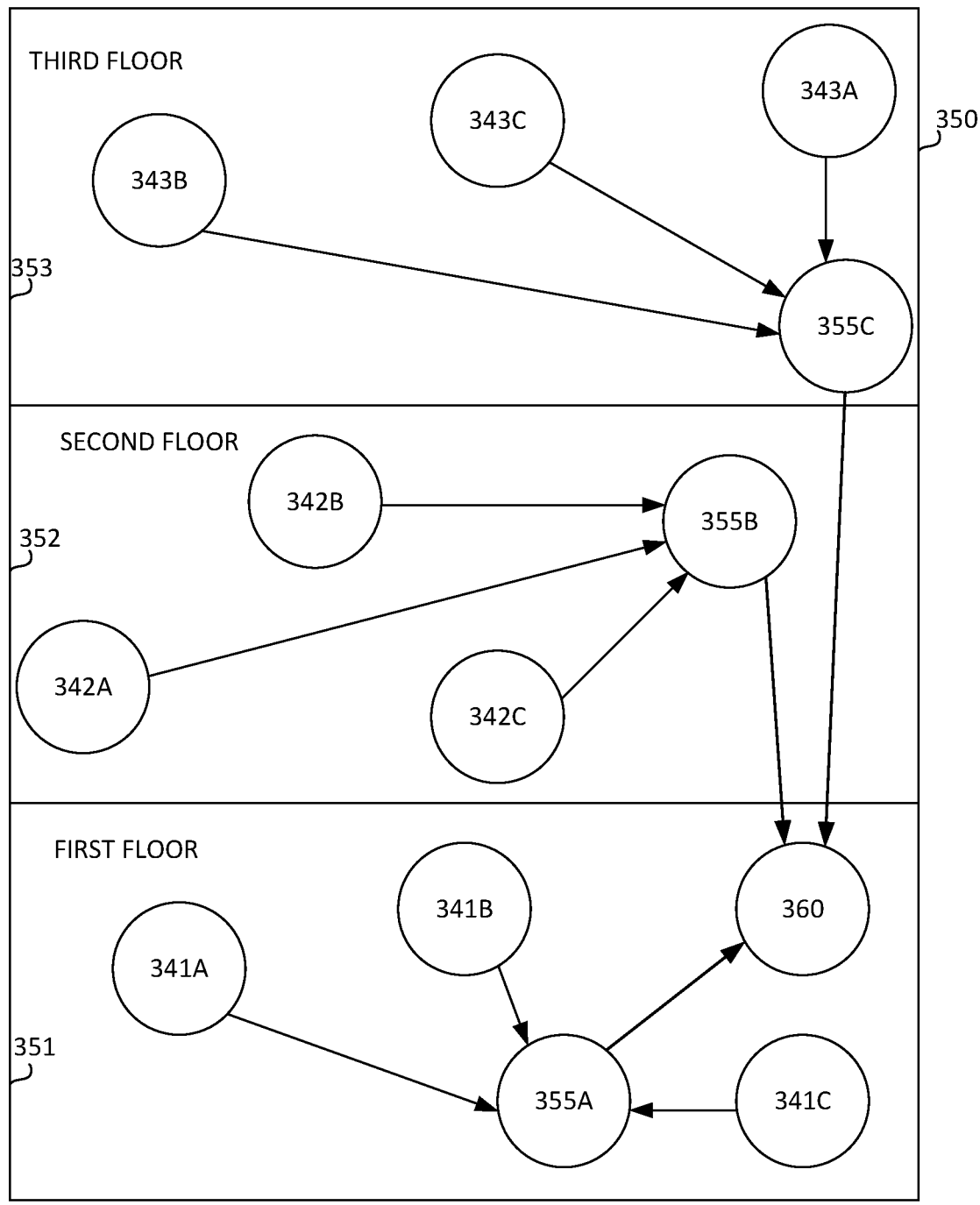
FIG. 3B is a depiction of one possible master-slave architecture for a plurality of registry devices.

Reference is now made to FIG. 3B, which is a depiction of one possible master-slave architecture for a plurality of registry devices, such as registry device 170 and registry device 370. Continuing with the discussion of FIG. 3A, and referring to FIG. 3B, a rack may have a slave registry device 370, and several such racks may be disposed on a floor of a building 350. (The slave registry device 370 may be the same as or similar to the local registry device 370 described above with reference to FIG. 3A.) For example, the first floor 351 of the building 350 may have three racks 341A, 341B, 341C each of the three racks holding at least one registry device 370. As discussed above, the three racks 341A, 341B, 341C may be physically situated in one or more rooms on the first floor 351 of the building 350. The at least one registry device 370 in the three racks 341A, 341B, 341C may be a slave registry device 370 which communicates with a higher order slave registry device, indicated by item number 355A. It is appreciated that the higher order slave registry device 355A may itself be one of the registry devices 370 in one of the three racks 341A, 341B, 341C, or, alternatively, one of the three racks, for example 341B, may have two slave registry devices 370. One of the two slave registry devices 370 in rack 341B may be in communication with various UPS devices, such as UPS devices 101 and 301, as described above. The second one of the two slave registry devices 370 in rack 341B may itself be the higher order slave registry device 355A. The higher order slave registry device 355A may communicate with a master registry device 360 (depicted here as being disposed on the first floor 351, solely for ease of depiction). The master registry device 360 may be the same as or similar to the remote registry device 370 described above with reference to FIG. 3A.

Similar to the first floor 351, a second floor 352 of the building 350 may have a number of registry devices 370 disposed in racks 342A, 342B, 342C. The registry devices 370 disposed in racks 342A, 342B, 342C may be slave registry devices 370 in communication with a higher order slave registry device 355B. The higher order slave registry device 355B itself may be in communication with the master registry device 360.

Similar to the first floor 351 and to the second floor 352, a third floor 353 of the building 350 may have a number of registry devices 370 disposed in racks 343A, 343B, 343C. The registry devices 370 disposed in racks 343A, 343B, 343C may be slave registry devices 370 in communication with a higher order slave registry device 355C. The higher order slave registry device 355C itself may be in communication with the master registry device 360.

It is appreciated that the above description is of a star-network topology on each floor 351, 352, 353. The star-network topologies for each floor are further depicted and described in a tree network topology for the building 350. This description is by way of example, and is not meant to limit or exclude other known topologies, for example, ring networks, mesh networks, fully connected networks, line and bus networks, for example.

In some cases, the example of FIG. 3B may be applied to a campus, a neighborhood, a village, and so forth instead of a single building, where the master registry device 360 of individual buildings may themselves be slave registry devices 370 in communication with the campus (or neighborhood, or village, and so forth) master registry device 360.

In any of the examples of registry devices 170, 355A, 355B, 355C, 360, 370 described above, an administrator may have access to a user interface enabling the administrator to examine any or all of the parameters provided by the registry device 170, 355A, 355B, 355C, 360, 370, in order to determine if there is a problem with one or more of the monitored UPS devices. The user interface may be any appropriate user interface, including, but not limited to a command line interface; a graphical user interface; a menu driven interface; a form based interface; and/or a natural language interface, as appropriate. Additionally, the user interface may enable the administrator to perform a query on a state of one or more of the monitored UPS devices.

As noted above, the registry device 170, 355A, 355B, 355C, 360, 370 may receive inputs from one or more UPS devices. Due to the bursty nature of data communications, the registry device 170, 355A, 355B, 355C, 360, 370 in some cases the registry device 170, 355A, 355B, 355C, 360, 370 may receive more data packets than can be processed at a given time. Accordingly, the registry device(s) 170, 355A, 355B, 355C, 360, 370 may comprise a data buffer (not depicted), which may briefly store incoming data packets before adding the information delivered in the data packets to log files and/or making the information available to the administrator via the user interface of the registry device 170, 355A, 355B, 355C, 360, 370.

As noted above, in the discussion of the registry device 170 of FIG. 1, the registry device 170, 355A, 355B, 355C, 360, 370 may comprise a communication port 197. The communication port may enable communication over a data communications network, for example, a Transmission Control Protocol (TCP)/Internet Protocol (IP) data communications network which is carrying data over an Ethernet network. Other appropriate network protocols may be used, and the mention herein above of TCP/IP over Ethernet, is by way of example. The communications port may have one or more resistors in parallel in the communications line, in order to reduce the chance of shorting out the registry device 170, 355A, 355B, 355C, 360, 370 due to a spike in voltage over the communications line.

Figure 4:
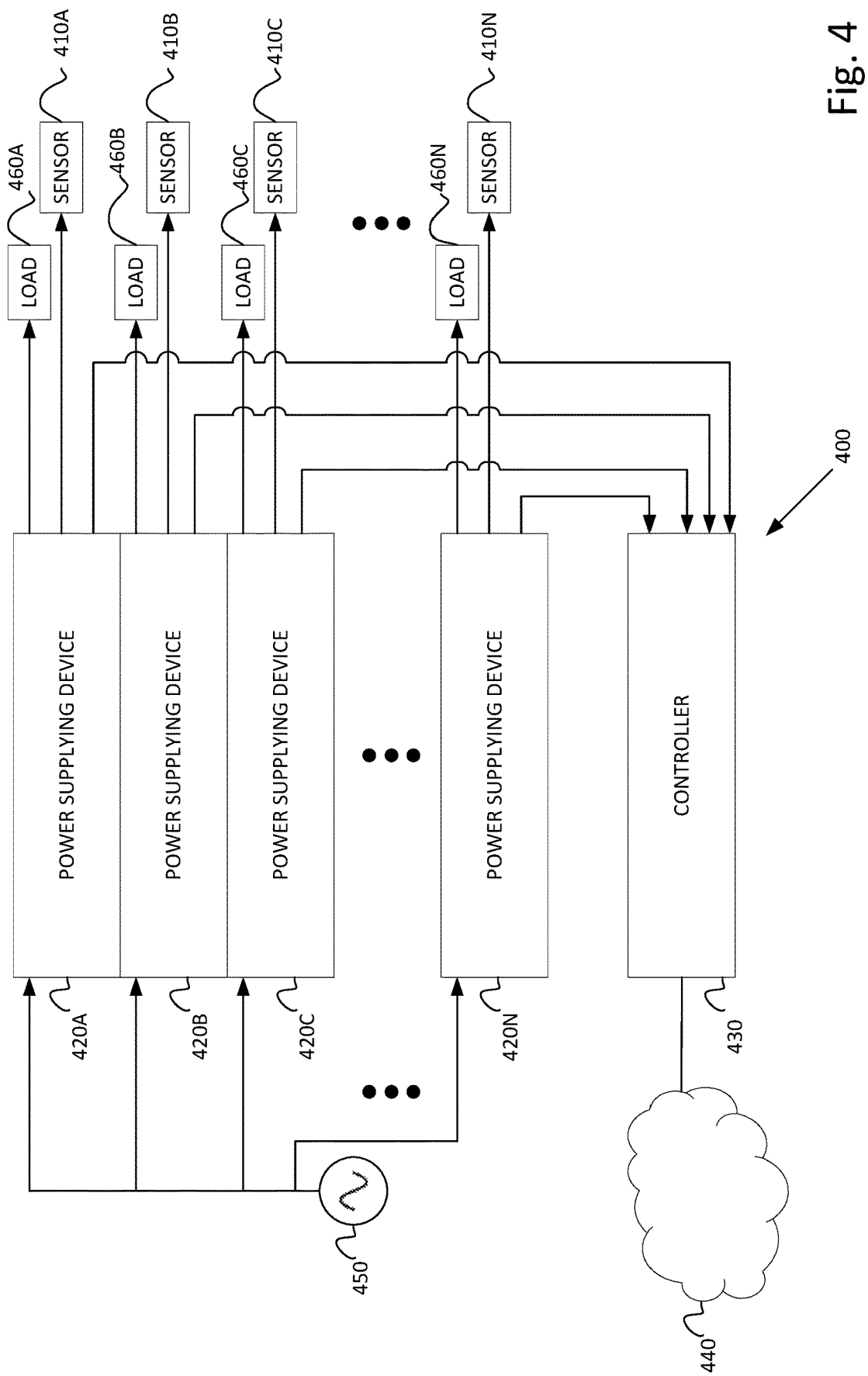
FIG. 4 is a simplified block diagram of an illustrative system in which the sensors of FIG. 1 are provided for each one of a plurality of power supplying devices.

Reference is now made to FIG. 4, which is a simplified block diagram of an illustrative system 400 in which sensors 410A, . . . , 410N, such as the plurality of sensors described above with reference to FIGS. 1 and 2, are provided, by way of example, for a plurality of power supplying devices 420A, . . . , 420N (it is appreciated that "N" in this context is used to refer to any natural number, i.e., an $n^{th}$ power supplying device, and not to a $15^{th}$ power supplying device). Each power supplying device of the plurality of power supplying devices 420A, . . . , 420N may be the same as or similar to the UPS device 101 described herein above. Each of the plurality of power supplying devices 420A, . . . , 420N is associated with at least one sensor 410A, . . . , 410N. The association of one particular power supplying device, such as power supplying device 420B with a sensor, for example, sensor 410B may be a one-to-one association, and may be a unique association. By way of example, the sensor 410B may be uniquely associated with the particular power supplying device 420B, and any indication provided by the sensor 410B may be uniquely indicative of a status of power supplying device 420B. By way of example, if the sensor 410B detects a normal output power level from the particular power supplying device 420B, then the particular power supplying device 420B is presumed to be providing the normal output power level. If the sensor 410B detects a sub-normal output power level from the particular power supplying device 420B, then the particular power supplying device 420B is presumed to be providing the sub-normal output power level.

The at least one sensor 410A, . . . , 410N may comprise a current sensing sensor such as a current transformer, a shunt resistor, a Rogowski coil, and a magnetic-field based transducer, an Ammeter, and so forth. Alternatively, the at least one sensor 410A, . . . , 410N may comprise a voltage sensing sensor, such as a voltmeter. Other appropriate sensors may be used as well. It is appreciated that any or all of the various sensors described above with reference to FIGS. 1-3B (e.g., S1-S6, T1, T2, V1, V2, V3, V'1, V'2, V'3, I1, I2, I3, I'1, I'2, I'3, etc.) in combination with the registry device 170 may correspond, in the example of FIG. 4, to the at least one sensor 410A, . . . , 410N.

Because each of the at least one sensor 410A, . . . , 410N may be uniquely associated with one of the plurality of power supplying devices 420A, . . . , 420N, an indication of abnormal output or no output by one of the at least one sensor 410A, . . . , 410N may indicate a problem with only its one associated power supplying device 420A, . . . , 420N.

In some configurations, such as when the plurality of power supplying devices 420A, . . . , 420N are housed in a rack or other shared common housing, there may be a controller 430 which may function as a controller of the plurality of power supplying devices 420A, . . . , 420N. (The controller 430 may be the same as or similar to the controller mentioned above with reference to the description of FIG. 1.) The controller 430 may also provide a communications interface (e.g., a bidirectional communication interface), through which the plurality of power supplying devices 420A, . . . , 420N communicate over a network 440. For example, the communications interface may comprise one of a serial communications interface, an Ethernet communications interface, a Simple Network Management Protocol communications interface, a Universal Serial Bus communications interface, or a cellular telephonic communication network communications interface. In this or any embodiment described herein, a network firewall may be provided on the network 440 (or similar and/or equivalent networks described above). Such a network firewall may be programmed to actively block communications to and from the sensors, such as sensors 410A . . . 410N. The controller 430 may also comprise one or more registry devices 170 in communication with the power supplying devices 420A, . . . , 420N. Alternatively or additionally, the one or more registry devices 170 may be on another host machine, which may be situated in or external to the rack. The one or more registry devices 170 may also be in communication with power supplying devices which are external to the rack, or located in a second rack.

Said network 440 may comprise a local area network, a wide area network, the Internet, or other appropriate network. Communications to the network 440 by the controller 430 may enable an administrator to communicate with the controller 430 and receive status updates about, for instance, operational status of the individual power supplying devices 420A, . . . , 420N among the plurality of power supplying devices 420A, . . . , 420N. For example, as noted above, if the sensor 410B detects a sub-normal output power level from the particular power supplying device 420B, then the particular power supplying device 420B may be presumed to be providing the sub-normal output power level. In such a case, the controller 430 may receive a status update indicating that the power supplying device 420B is providing a sub-normal output.

Being connected to the network 440 is not, however, without risks. For example, an attacker (sometimes referred to as a "hacker") may attempt to penetrate the network 440 and gain entry and control of the controller 430. In the event of a successful attack, and the attacker has gained control of the controller 430, the attacker may then attempt to further gain control of some or all of the power supplying devices 420A, . . . , 420N.

Communications between the controller 430 and the power supplying devices 420A, . . . , 420N may deliberately be limited, or restricted to a one way communication, in order to reduce the likelihood of success of attacks originating from the controller 430. In order to further close down one additional channel which may be used as an attack route from the controller 430 to the power supplying devices 420A, . . . , 420N, indications of the operational status of the plurality of the power supplying devices 420A, . . . , 420N may not be sent to the controller 430. Rather, the at least one sensor 410A, . . . , 410N, which, by design may not have access to and may not be accessible from the network 440, and which is uniquely associated with a particular one of the plurality of power supplying devices 420A, . . . , 420N may passively detect the operational status of an associated particular one of the plurality of power supplying devices 420A, . . . , 420N. It is noted that because the at least one sensor 410A, . . . , 410N may be unable to access the network 440 and may be inaccessible via the network 440, it may be effectively blocked from communication originating outside the network 440. Alternatively, a private data communication network, which is not connected to the network 440 (and is only accessible by, for example, the power supplying devices 420A, . . . , 420N and the at least one sensor 410A, . . . , 410N), may provide a means of communication accessible only to those devices which are connected to the private data communication network.

The plurality of power supplying devices 420A, . . . , 420N may receive an alternating current (AC) power input from an AC power source 450, which may be internally routed directly to output to a load, such as loads 460A, . . . , 460N; converted to direct current (DC) and stored internally in a power storage device, such as a battery or a string of batteries; or partially internally routed directly to output to a load, such as loads 460A, . . . , 460N and partially converted to direct current (DC) and stored internally in a power storage device, such as a battery or a string of batteries.

In the event of a failure of one of the power supplying devices 420A, . . . , 420N, the administrator may determine that one particular rack of power supplying devices, is the source of the failure. However, it may not be immediately apparent which individual power supplying device (e.g., power supplying device 420B) has failed. Since communications between the power supplying devices 420A, . . . , 420N and the controller 430 may have been limited or restricted to reduce the risk of an attack using the controller 430 as the attack's starting point, the controller 430 might not have access to information about the particular failed power supplying device (e.g., power supplying device 420B).

In such a case, by consulting (e.g., evaluating results received from) the sensors 410A, . . . , 410N, the administrator may determine which of the sensors 410A, . . . , 410N is indicating a problem with a particular one of the power supplying devices 420A, . . . , 420N. It is appreciated that in some cases, e.g., total failure, the "indication" shown by an individual sensor may indicate nothing. However, if only one individual sensor among the sensors 410A, . . . , 410N is not showing a sign of life from the power supplying devices 420A, ..., 420N, it may be clear which of the plurality of power supplying devices 420A, ..., 420N is failing or has failed.

Although examples are described above, features and/or steps of those examples may be combined, divided, omitted, rearranged, revised, and/or augmented in any desired manner. Various alterations, modifications, and improvements will readily occur to those skilled in the art. Such alterations, modifications, and improvements are intended to be part of this description, though not expressly stated herein, and are intended to be within the spirit and scope of the disclosure. Accordingly, the foregoing description is by way of example only, and is not limiting. For example, assorted UPS topologies not mentioned above, or UPS topologies mentioned but not described in detail may be monitored by the registry device. The registry device may be geographically and/or electrically isolated from other elements in the systems described hereinabove. AC may be one phase or three phase. Any of the embodiments described with reference to FIG. 1, 3A, or 3B, for example, may, be combined or augmented with the embodiment described with reference to FIG. 4.

The invention claimed is:

1. An apparatus comprising:
    a plurality of input sensors;
    a plurality of output sensors;
    a plurality of uninterruptible power supplies (UPSs), each comprising: an input coupled to a corresponding one of the plurality of input sensors, and an output coupled to a corresponding one of the plurality of output sensors;
    a one-way communication module configured to transmit a secure one-way communication over a communications network for monitoring the plurality of UPSs; and
    a controller connected to the plurality of input sensors, the plurality of output sensors, and the one-way communication module, wherein the controller is configured to:
        receive first data measurements from the plurality of input sensors and second data measurements from the plurality of output sensors,
        process the first data measurements and the second data measurements, thereby identifying abnormal output of at least one of the plurality of UPSs, and
        send, based on the identifying of the abnormal output and using the one-way communication module, a notification over the communications network.

2. The apparatus of claim 1, wherein the plurality of input sensors and the plurality of output sensors are wirelessly connected to the controller.

3. The apparatus of claim 1, further comprising wired connections configured to connect the plurality of input sensors and the plurality of output sensors to the controller.

4. The apparatus of claim 1, wherein the controller comprises a real-time clock.

5. The apparatus of claim 4, wherein the notification comprises a timestamp provided by the real-time clock.

6. The apparatus of claim 1, wherein each of the plurality of input sensor comprises a voltage sensor configured to perform an input voltage measurement.

7. The apparatus of claim 1, wherein each of the plurality of output sensors comprises a voltage sensor configured to perform an output voltage measurement.

8. The apparatus of claim 1, further comprises:
    a second plurality of input sensors and a second plurality of output sensors; and
    a third plurality of input sensors and a third plurality of output sensors;
    wherein each of the plurality of UPSs is a three-phase UPS comprising a second input coupled to a corresponding one of the second plurality of input sensors, a second output coupled to a corresponding one of the second plurality of output sensors, a third input coupled to a corresponding one of the third plurality of input sensors, and a third output coupled to a corresponding one of the third plurality of output sensors,
    wherein the plurality of input sensors and the plurality of output sensors correspond to a first phase of three phases,
    wherein the second plurality of input sensors and the second plurality of output sensors correspond to a second phase of the three, and
    wherein the third plurality of input sensors and the third plurality of output sensors correspond to a third phase of the three.

9. The apparatus of claim 1, further comprising a plurality of pairs of battery sensors configured to measure a positive terminal of a battery of each of the plurality of UPSs and a negative terminal of the battery of each of the plurality of UPSs.

10. The apparatus of claim 1, wherein at least one of the plurality of UPSs comprises at least one of: an offline UPS, a line interactive UPS, or an online UPS.

11. The apparatus of claim 1, further comprising a second one-way communication module configured to receive the secure one-way communication via the communication network.

12. The apparatus of claim 11, wherein the controller is configured to receive data sent from each UPS of the plurality of UPSs.

13. The apparatus of claim 1, further comprising a second controller coupled to the one-way communication module, the second controller being operative to perform two-way communication over a second communications network.

14. The apparatus of claim 1, wherein at least one of the plurality of input sensors or at least one of the plurality of output sensor is configured to measure electrical current.

15. The apparatus of claim 14, wherein the electrical current comprises at least one of an input electrical current or an output electrical current.

16. The apparatus of claim 1, wherein at least one of the plurality of input sensors or at least one of the plurality of output sensors is configured to measure at least one of a positive current from a battery or a negative current from a battery.

17. The apparatus of claim 1, wherein at least one of the plurality of input sensors or at least one of the plurality of output sensors is configured to measure a frequency of an electrical current.

18. The apparatus of claim 1, wherein the one-way communication module receives information only from the plurality of input sensors and the plurality of output sensors.

19. The apparatus of claim 1, wherein the one-way communication module blocks communication to the plurality of UPSs.

20. The apparatus of claim 1, wherein the apparatus comprises an independent power supply, and the independent power supply is independent of power supplied to the plurality of UPSs.

* * * * *